(12) United States Patent
Thallner

(10) Patent No.: US 9,418,882 B2
(45) Date of Patent: Aug. 16, 2016

(54) DEVICE AND METHOD FOR ALIGNING SUBSTRATES

(71) Applicant: EV GROUP E. THALLNER GMBH, St. Florian am Inn (AT)

(72) Inventor: Erich Thallner, St. Florian (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/891,781

(22) PCT Filed: Jun. 17, 2013

(86) PCT No.: PCT/EP2013/062473
§ 371 (c)(1),
(2) Date: Nov. 17, 2015

(87) PCT Pub. No.: WO2014/202106
PCT Pub. Date: Dec. 24, 2014

(65) Prior Publication Data
US 2016/0148826 A1    May 26, 2016

(51) Int. Cl.
*H01L 21/461* (2006.01)
*H01L 21/68* (2006.01)
*H01L 21/67* (2006.01)
*H01L 21/66* (2006.01)
*B65G 47/26* (2006.01)

(52) U.S. Cl.
CPC .............. *H01L 21/681* (2013.01); *B65G 47/26* (2013.01); *H01L 21/67092* (2013.01); *H01L 22/26* (2013.01)

(58) Field of Classification Search
CPC ................................................. H01L 21/67121
See application file for complete search history.

(56) References Cited

U.S. PATENT DOCUMENTS

| | | | | |
|---|---|---|---|---|
| 5,314,107 | A | * | 5/1994 | d'Aragona ........ H01L 21/67121 228/116 |
| 8,846,495 | B2 | * | 9/2014 | Deguchi ............ H01L 21/67121 257/300 |
| 2007/0252994 | A1 | | 11/2007 | Bijnen et al. ................... 356/401 |
| 2009/0251699 | A1 | * | 10/2009 | George ................. H01L 21/681 356/401 |
| 2012/0237328 | A1 | * | 9/2012 | Figura .................... H01L 21/681 414/749.6 |
| 2013/0244350 | A1 | * | 9/2013 | Horikoshi ......... H01L 21/67092 438/16 |
| 2015/0170950 | A1 | * | 6/2015 | Thallner ........... H01L 21/67121 414/222.05 |

FOREIGN PATENT DOCUMENTS

| | | |
|---|---|---|
| AT | 405775 | 11/1999 |
| EP | 2299472 | 3/2011 |
| WO | WO 2010/038454 | 4/2010 |
| WO | WO 2014/154272 | 10/2014 |

OTHER PUBLICATIONS

International Search Report from corresponding International Patent Application No. PCT/EP2013/062473, dated Sep. 9, 2013.

* cited by examiner

*Primary Examiner* — Stephen W Smoot
(74) *Attorney, Agent, or Firm* — Kusner & Jaffe

(57) ABSTRACT

A method for alignment and contact-making of a first substrate with a second substrate using several detection units as well as a corresponding device.

11 Claims, 7 Drawing Sheets

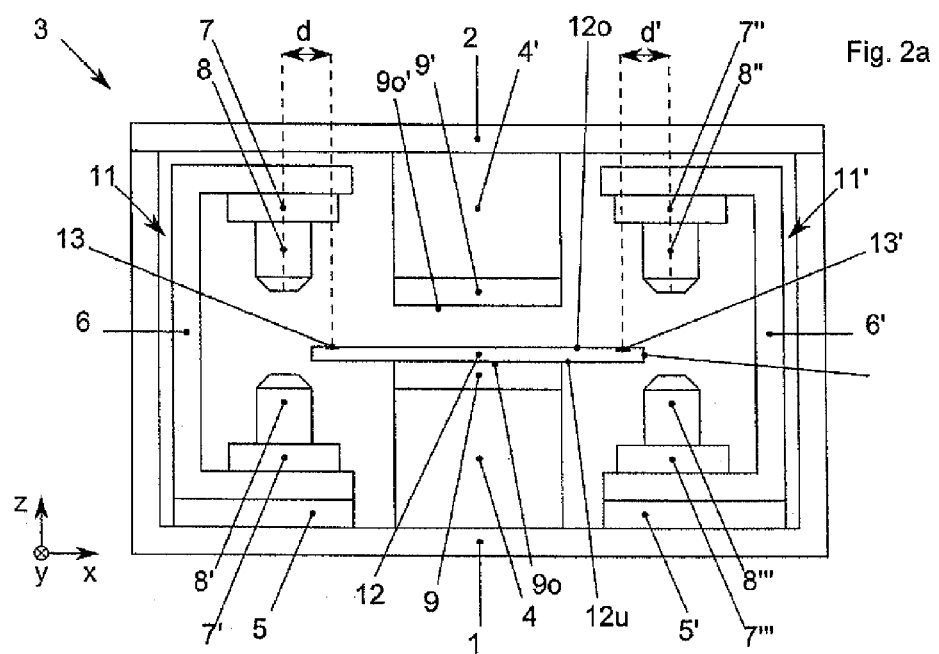

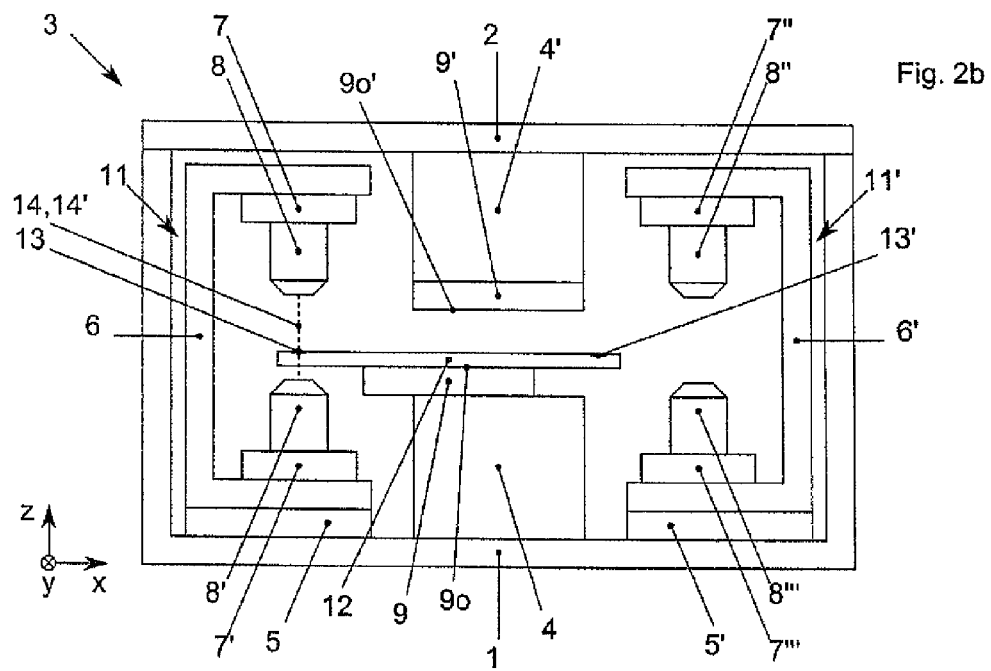
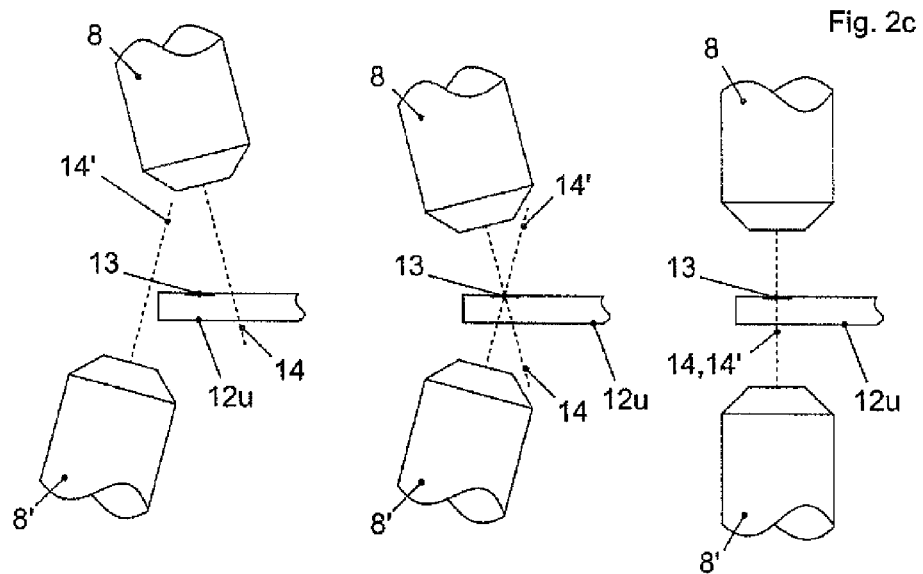

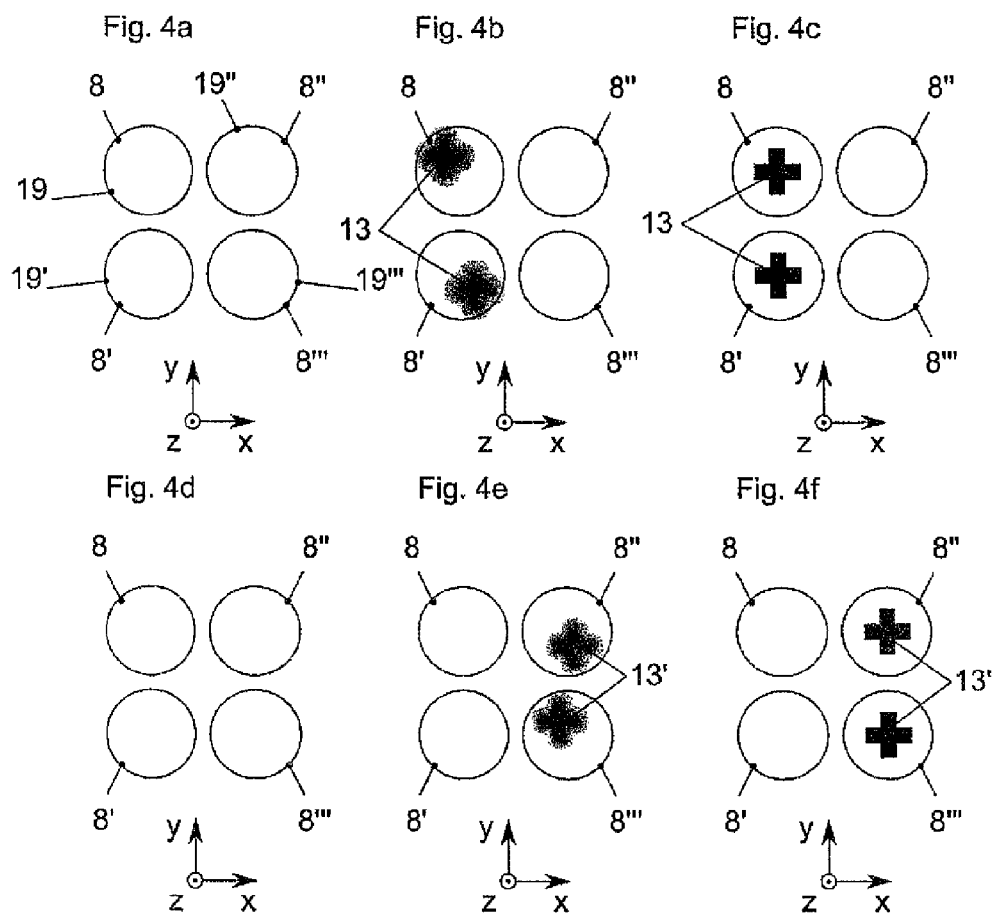

DEVICE AND METHOD FOR ALIGNING SUBSTRATES

FIELD OF THE INVENTION

This invention relates to a method for alignment and contact-making of a first substrate with a second substrate and a corresponding device.

BACKGROUND OF THE INVENTION

In the semiconductor industry substrates have been joined to one another for years. It is generally necessary to align the substrates to one another before the actual joining process, bonding. The substrates are aligned to one another with alignment systems. The alignment systems are able to detect alignment marks on the substrates and to align the substrates to one another such that the alignment marks complement one another accordingly. In most cases the alignment marks are complementary to one another.

In order to correctly align two substrates to one another, at least four alignment marks, two on each substrate, are necessary. The alignment marks are preferably as near as possible to the edge of the substrate in order to increase the alignment accuracy.

In an alignment process it is always distinguished between the boundary layer surface and the surface of a substrate which is opposite the boundary layer surface. The boundary layer surface is the surface of the substrate which later becomes part of the bond boundary surface. An alignment mark which is located on a boundary layer surface is called a face-side alignment mark, an alignment mark on the correspondingly opposite side is called a back-side alignment mark. Accordingly there are four basic alignment versions, back-to-back, face-to-face, face-to-back and back-to-face alignments.

In back-to-back alignment no serious problems arise since the alignment marks are actually always on surfaces which are freely accessible to all optics, pointed to the outside.

One special challenge in alignment technology is the face-to-face version. In this alignment version the alignment marks are always aligned to the bond boundary surface, therefore the plane between the two substrates. One possibility is transmission detection, transmission measurement and transmission alignment which are only used when all layers on the substrate, including the substrate itself, are transparent to the electromagnetic waves of the electromagnetic spectrum used at the time. This is not always the case for IR radiation and visible light.

The alignment system in patent AT 405775B follows another, third approach. This patent shows that it is possible to cause the front surfaces of the two substrates which are to be aligned to one another to approach one another almost to contact. The upper and lower substrate are fixed by corresponding sample holders on an upper and lower carriage and can move in translation, on alternate sides out of the alignment station into a measurement station, in which the respective x and y positions of the alignment marks which are the left or right at the time on the respectively upper and lower substrate can be correctly measured. The advantage in patent AT 405775B is mainly that the substrates before and during the alignment process have an extremely small spacing in the z direction, and therefore when the two substrates approach one another they must also only traverse one very short path in the z direction in order to be brought into contact with one another. On this extremely short path the deviation from the desired alignment accuracy in the x and y direction is hardly of any more importance.

One of the most serious technical problems is the positioning faults which arise by the movement of the substrates and which can occur especially in an environment which can be evacuated. Under these conditions air bearings can no longer be used, with which actually a frictionless sliding of the carriages should be ensured.

SUMMARY OF THE INVENTION

The object of this invention is therefore to devise a device and a method for alignment and contact-making of substrates, with which more accurate and more efficient alignment and contact-making of substrates are enabled.

This object is achieved with the features of the independent claim(s). Advantageous developments of the invention are given in the dependent claims. All combinations of at least two of the features given in the specification, the claims and/or in the figures fall within the scope of the invention. For given values ranges, values which lie within the indicated limits should be considered disclosed as boundary values and able to be claimed in any combination.

The invention is based on the idea, especially by providing several detection positions outside of the alignment position, of detecting the relative positions of two substrates to one another with the minimal travel paths of the substrate, preferably without changing a distance A between the substrates during the detection, after detection, contact-making taking place solely by movement of the substrates in the z direction (therefore towards one another). The distance A between the substrates is minimum as much as possible, without moving detection means between the substrates in a detection of features on the substrates, preferably of alignment marks, in one detection position. Thus both the travel paths in the X and Y direction during detection and alignment as well as the travel paths in the Z direction after alignment up to contact-making can be minimized.

The embodiments of the invention show mainly a new and inventive apparatus with which the alignment and contact-making of substrates for the first time is possible with high precision in a vacuum.

It is especially provided that the detection takes place by movement of the substrates in different directions in the X-Y plane into at least two different detection positions, preferably by opposed parallel displacement of the substrates.

According to one advantageous embodiment of the invention it is provided that the first and fourth alignment marking and/or the second and third alignment marking are arranged oppositely in the Z direction. In particular it is advantageous if the alignment markings are located on sides facing away from one another, preferably on the backs of the contact surfaces of the substrates and/or detection devices of the detection units as detection device pairs are made to detect a detection side facing away from the contact surface. This can be implemented especially in that the detection devices are parallel to and laterally from corresponding adjustment apparatus of the alignment unit, preferably laterally in pairs opposite one another.

To the extent the detection of the first and second alignment marking and/or the detection of the third and fourth alignment marking takes place in a coherent method step, especially at the same time, especially with a first detection unit for detection of the first and/or second alignment markings and a second detection unit for detection of the third and/or fourth alignment markings, extremely short travel paths can be implemented with only two detection positions.

It is furthermore advantageous if according to one advantageous embodiment a first and/or second adjustment unit is provided as a contact-making means. Preferably the adjustment units are arranged oppositely flush one another and they are used for adjustment and movement, especially including rotational movement, of the mounts for holding the substrates.

According to another advantageous embodiment of the invention it is provided that the detection means have a first detection unit for detection of the first and/or second alignment markings and a second detection unit located on the side of the mounts opposite the first detection unit, for detection of the third and/or fourth alignment markings.

Here it is especially advantageous if the first detection unit has several electromagnetic units, especially two first detection devices located oppositely, preferably microscopes, and/or the second detection unit has several electromagnetic units, especially two second detection devices located oppositely, preferably microscopes.

To the extent the first detection unit has a first optics fixing for attaching the first detection devices and/or the second detection unit has a second optics fixing for attaching the second detection devices, the detection units and the detection devices, especially after prior calibration, can be fixed relative to one another so that calibration must be done only once for a plurality of measurements. Furthermore it can be advantageous if the first detection devices can be moved jointly by a first fixing translation unit which holds the first optics fixing and/or the second detection devices can be moved jointly by a second fixing translation unit which holds the second optics fixing. In this way the calibrated optics fixings and detection devices can also be jointly moved after calibration.

The invention can be further improved if according to one embodiment the first detection devices can each be moved separately via first optics translation units on the first optics fixing and/or the second detection devices can each be moved separately via second optics translation units on the optics fixing.

The invention relates especially to a device (alignment system) which can measure alignment markings of two substrates which lie preferably as far as possible on the lateral peripheral edge in one peripheral region by comparatively short travel paths in the X and/or Y direction (therefore along the contact surfaces). Furthermore the invention relates to a method which can measure alignment markings of two substrates which lie preferably as far as possible on the edge by comparatively short travel paths in the X and/or Y direction. Comparatively short means especially less than half the diameter of the substrate per measurement step or detection step. The travel path is defined as the path from the respective alignment position to one detection position in the X, Y and/or Z direction.

Substrates are defined as product or carrier substrates used in the semiconductor industry. A carrier substrate is used as reinforcement of the function substrate (product substrate) in the different working steps, especially during back-thinning of the function substrate. Substrates are especially wafers, either with a flat or a notch.

Functional components of the device such as carriages, motors, optics, and holders are preferably installed in a housing. The housing can be especially hermetically sealed to the vicinity. The housing preferably has a cover which enables access to the functional components. In particular there is a lock door on at least one side of the housing. A corresponding load lock can be connected upstream or downstream to the lock door. When using a load lock upstream and/or downstream of the lock door, preferably in the housing an atmosphere can be set which is other than in the vicinity of the housing. The atmosphere is preferably a negative pressure atmosphere.

During an alignment process the pressure within the housing is equal to 1 bar, preferably less than $10^{-1}$ mbar, more preferably less than $10^{-3}$ mbar, most preferably less than $10^{-5}$ mbar, most preferably of all less than $10^{-8}$ mbar.

During an alignment process the pressure outside the housing is equal to 1 bar, preferably less than $10^{-1}$ mbar, more preferably less than $10^{-3}$ mbar, most preferably less than $10^{-5}$ mbar, most preferably of all less than $10^{-8}$ mbar.

All substrates can be placed in the interior either via the lock door or the cover. The substrates are preferably transported into the interior via the lock door.

In one special embodiment the substrate or the substrate stack comprising the substrates which have been aligned to one another are transported out of the housing by means of a robot.

Especially two adjustment units on which mounts can be moved in the X, Y, Z direction and/or respectively in the pertinent rotation directions, especially are adjustable located. The substrates can be held on the mounts and the alignment unit is used for alignment and contact-making of the substrates.

Especially two detection devices (preferably optics) at a time which are located on corresponding translation units and/or goniometers are mechanically coupled to one another, especially can be fixed relative to one another via an especially U-shaped optics fixing. They are hereinafter called detection means.

It is conceivable to orient each individual detection device and thus mainly the optical axis in space by a generally triple-axis goniometer which is located between the optics and the translation unit. The translation units or goniometers between the detection device and the optics fixing are used for individual and independent displacement of each detection device relative to the other detection devices.

The accuracy with which the detection devices can be individually moved is better than 1 mm, preferably better than 100 µm, highly preferably better than 10 µm, more preferably better than 1 µm, still more preferably better than 100 nm, most preferably of all better than 10 nm.

The optics fixings are each located especially on another fixing translation unit which is responsible for the translation of the entire optics fixing which has the respectively assigned detection devices.

There is at least one detection means on one side of the mounts and at least another detection means on another, especially opposite side.

The accuracy with which the optics fixing can be moved is better than 1 mm, preferably better than 100 µm, highly preferably better than 10 µm, more preferably better than 1 µm, still more preferably better than 100 nm, most preferably of all better than 10 nm.

The travel path of each optics fixing for each of the three translation directions is greater than 10 µm, preferably greater than 1 mm, more preferably greater than 10 mm, most preferably greater than 100 mm, but especially smaller than two thirds, preferably smaller than half the diameter of the contact surface of the first and/or second substrate.

The optics fixing, the set of all components which are coupled by the optics fixing, and the translation unit for the optics fixing are called a detection unit or detection means.

In the alignment unit, especially on the top or bottom, there is one adjustment unit at a time for each of the two substrates. On each adjustment unit there is a sample holder or a mount, Each sample holder has especially six degrees of freedom, three degrees of freedom of translation along the X, Y and Z direction and three degrees of freedom of rotation around the X, Y and Z axis, in the following called angles alpha, beta and gamma. The degrees of freedom of translation are used for displacement of the sample holder and thus of the substrate within the X-Y plane spanned by the X and Y direction and for causing the two substrates to approach one another along the Z direction. The rotation possibility around the X, Y and Z axis is used for execution of wedge fault compensation and/or orientation of the substrate. The rotations around the X, Y and Z axis are especially rotations with small rotation angles so that tilting could also be considered.

Sample holders can be used as mounts for the substrates, especially with the following different fixing mechanisms:
vacuum sample holders
electrostatic sample holders
sample holders with an adhesive surface
sample holders which are based on Venturi and Bernoulli effects
magnetic sample holders
sample holders with mechanical fixings When using an embodiment of the invention in a vacuum environment however vacuum sample holders and/or Venturi and/or Bernoulli sample holders are only restricted, in the extreme case not used at all. The use of a vacuum sample holder would be conceivable when the evacuation is produced in the interior by a first vacuum pump to an atmosphere which is produced by a second vacuum pump from the control loop of the first vacuum pump.

Before the actual alignment process, a calibration of the detection means is advantageous. The goal of calibration is especially to place the intersection point of the optical axes of two opposite detection devices in the center of one alignment marking of a calibration substrate. This calibration takes place preferably separately for all detection devices of the detection units. The calibration ensures that opposing (upper and lower) detection devices of one detection unit have a common focus region.

In one preferred embodiment the optical axes of the two opposing detection devices are collinear to one another. For this reason the optics have especially degrees of freedom of rotation, preferably by arrangement on a goniometer.

One intersection point or the intersection point of the optical axes of the detection devices is arranged especially such that the corresponding alignment markings of the substrates to be aligned in the detection position in the X, Y and Z direction can be at least focused and/or can be located or are located at this point. Generally the positions of the alignment markings change from substrate pair to substrate pair. This measure further minimizes the travel paths.

The intersection points of the optical axes are preferably located in the focus plane of the optics. Resolution and the region of the depth of field are two competing parameters. The greater the resolution, the smaller the region of the depth of field and vice versa. If therefore optics are used with a high resolution they have a correspondingly small region of the depth of field. For this reason the alignment marks of the upper and lower substrate must remain at the same time within a very small region of the depth of field in order to be able to be sharply imaged. The intersection point of the optical axes is located in the region of the depth of field of the corresponding detection devices.

It is advantageous if the detection devices are calibrated such that the contact surfaces and/or the alignment markings of the substrates are located in the detection positions of the respective detection units within the regions of the depth of field. In this way refocusing can be omitted.

The optical axes of two opposing optics are preferably aligned to one alignment marking so that at least the intersection point of the optical axes comes to rest in the alignment marking, and thus in the focus region. For the case in which the optical axes for any reason do not intersect at one point within the focus region, at least the distance between the optical axes should be known. If specifically in the later alignment process one of the optical axes is aligned to one alignment mark of a substrate, the substrate opposite the first substrate can still be correctly oriented by the substrate opposite the first substrate being offset in order to position the spacing between the two optical axes.

In the following some examples are given why the optical axes of two opposing optics drift over time and therefore shift their intersecting points with the focus plane.

During current operation, the optical axes will be shifted mainly due to vibrations and/or thermal expansion of the entire system. Therefore after some time, even if a rough change has not been done, such as for example maintenance, an expansion or a replacement of the optics, a software update, a hardware update, etc. on the embodiment, a complete calibration of the system must be repeated. But in most cases the deviations due to thermal drift and minor vibrations are very small. Therefore it is sufficient to simply move the calibration mask back into position and to note the difference of the alignment marks which is measured by the upper or lower optics. This offset must of course be considered in the alignment of later wafers. Generally this offset value is indicated in the software with which the embodiment is operated. The software then provides for its moving lower and/or upper sample holders accordingly by the offset value further in the +x/−x or +y/−y direction. The underlying problem and the technique for managing it are however known to one skilled in the art in the field.

After calibration has been done for the at least two detection units, two X-Y reference positions are detected, with respect to which the translational and rotational movement of the substrates can be controlled. The control of the movement of the substrates and/or detection means takes place by means of an especially software-support control apparatus.

For the sake of completeness, it should therefore be mentioned that the coincidence of the intersection point of the optical axes with the alignment marks of the calibration substrate is advantageous, but not necessary to carry out computations as long as the distance is known between the intersection points of the optical axes with the focus plane in which the later alignment marks of the substrates which are to be oriented to one another are located.

The invention makes it possible especially after calibration of the system to fix a first substrate on a first mount (sample holder) and a second substrate on a second mount. The first and the second mount move the two fixed substrates, especially at the same time and/or symmetrically, into different, separate detection positions which are located especially laterally opposite the alignment unit.

Afterwards the respective detection unit in whose field of view there is one alignment marking detects/measures the X-Y position of the alignment marking. After detection, the opposite alignment markings of the two substrates are measured so that the detection unit which does not measure in the first measurement process detects the alignment mark which is the other at the time and which was not detected in the first measurement process. There are especially two detection steps in succession which each detect two alignment markings at a time in one step.

The X-Y position of the two substrates can be determined from the eight measured values which have been determined in this way, one X and one Y position for four alignment markings at a time. The upper and lower adjustment units provide then for the two mounts and thus the substrates to travel into the respective alignment position. Afterwards the two substrates make contact by their relative approach to one another. This takes place by a movement of the upper and/or lower sample holder in the Z direction onto one another.

In one advantageous embodiment of the invention it is provided that one of the two mounts do not move during the relative approach or that it is fixed relative to the alignment unit in order to limit any translation errors to one axis of movement and one motor of movement.

Therefore the invention is based mainly on the idea of positioning the detection means necessary for the alignment process such that two detection devices which are pointed at one another, especially on the respectively opposite side of the alignment unit, detect the X-Y positions of the alignment markings of the substrates. In the method of the invention the travel path of the two substrates is minimized in this way.

To the extent in the method of the invention the two mounts move especially exclusively along the X axis, translation units with a very high accuracy and reproducibility can be used. To the extent drift takes place in one Y direction, this can be advantageously measured and compensated.

A spacing of the substrates in the Z direction is set to be constant and/or minimized before detection up to alignment, especially to be less than 1 cm, preferably less than 1 mm, still more preferably less than 100 μm.

The advantage of the invention lies mainly in that the device can also be operated in a vacuum. Due to the travel paths of the upper and/or lower mount and thus of the first (lower) and/or second (upper) substrate, which paths are comparatively short, mechanical components for carriages/bearings/stepping motors which are vacuum-suitable can be used. Thus it is possible for the first time to install a bond module and an alignment module in a vacuum cluster, preferably a high vacuum cluster, and to transport the substrate from the alignment module to the bond module within a region which can be evacuated without exposing the substrate again to an atmosphere.

Another advantage lies in the possibility of using visible light. The use of transmission techniques can be abandoned. Furthermore all substrates, even substrates which are opaque to the wide range of the electromagnetic spectrum, can be measured since the alignment markings can be found on the surfaces without having to transilluminate the substrate.

In all figures the adjustment units are always shown within the housing. Of course it would also be conceivable for the adjustment units to be located outside the housing and by corresponding vacuum penetrations to control the sample holders which are located within the housing. The same also applies to the detection means. In the optimum embodiment which is however of course technically difficult to implement, only the two substrates which are to be aligned to one another would be located in vacuum.

The embodiment of the invention is used preferably in a vacuum cluster, more preferably in a high vacuum cluster, most preferably in an ultrahigh vacuum cluster, together with other modules. The other modules can be for example one or more of the following modules
heating module
cooling module
lacquering module
bond module
debond module
inspection module
lamination module
surface treatment module
plasma module In one special embodiment the substrates which have been aligned to one another in are clamped to one another with a method mentioned in patent PCT/EP2013/056620, to which reference is made. The clamping method uses small magnet bodies for prompt, efficient and easy fixing of the two substrates which are brought into contact and which are aligned to one another. The two substrates can also be prefixed via molecular forces. The clamping can also take place purely mechanically.

To the extent device features are disclosed here and in the following description of the figures they should also be considered disclosed as method features and vice versa.

BRIEF DESCRIPTION OF THE DRAWINGS

Other advantages, features and details of the invention will become apparent from the following description of preferred exemplary embodiments using the drawings which show a schematic view:

FIG. 1b shows a schematic cross section of the embodiment according to FIG. 1a,

FIG. 2a shows a schematic cross section of the embodiment according to FIG. 1a with a loaded calibration substrate in a first calibration step, FIG. 2b shows a schematic cross section of the embodiment according to FIG. 1a with a loaded calibration substrate in a second calibration step, FIG. 2c shows a schematic enlargement of three possible calibration situations in the calibration step according to FIG. 2b, FIG. 4a shows a schematic view of fields of view of detection means in a first calibration step of a first detection unit, FIG. 4b shows a schematic view of fields of view of the detection means in a second calibration step of the first detection unit, FIG. 4c shows a schematic view of fields of view of the detection means in a third calibration step of a first detection unit, FIG. 4d shows a schematic view of field of view of the detection means in a first calibration step of a second detection unit, FIG. 4e shows a schematic view of field of view of the detection means in a second calibration step of the second detection unit, FIG. 4f shows a schematic view of field of view of the detection means in a third calibration step of a second detection unit.

DETAILED DESCRIPTION OF THE INVENTION

In the figures, advantages and features of the invention are labeled with reference numbers which identify them according to embodiments of the invention, components and features with the same function and/or a function with the same action being labeled with identical reference numbers.

Figure 1A:
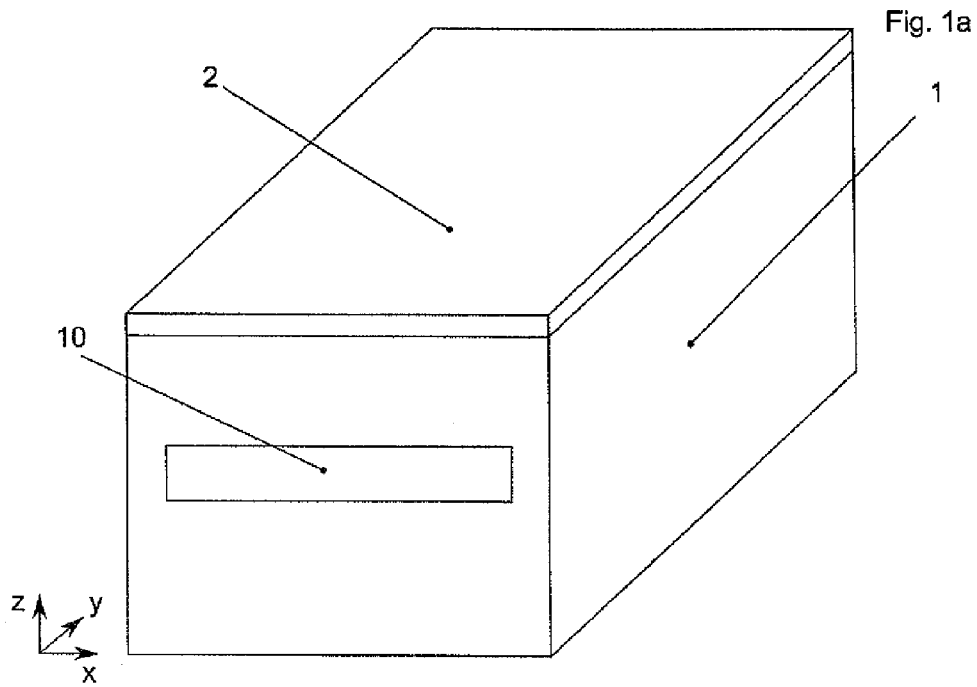
FIG. 1a shows a schematic external perspective of one embodiment of the device.
Figure 1B:
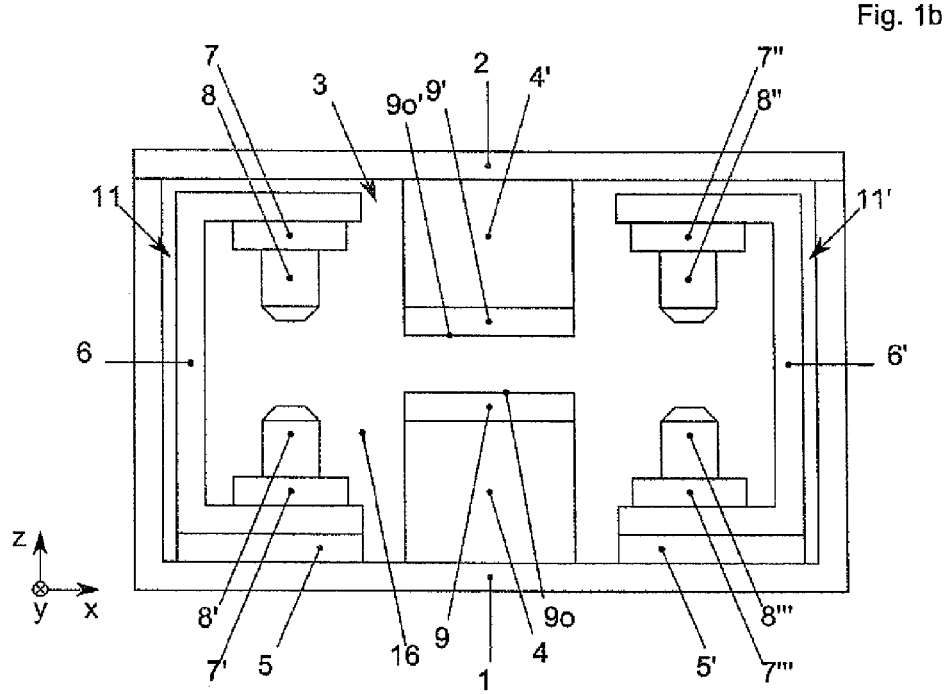

FIG. 1 shows one embodiment of the device of the invention. The components which are necessary for executing the method of the invention are located preferably in a vacuum-tight housing 1 which can be opened and closed vacuum-tight from one side via a cover 2. The loading and unloading of first substrates 15 and second substrates 15' which are to be aligned to one another takes place preferably through a lock door 10. The lock door 10 is vacuum-tight and separates an interior 16 which is formed by the housing 1 and the cover 2 from the surrounding atmosphere.

If different pressure conditions should prevail between the interior 16 and the surrounding atmosphere, a lock (not shown) can be connected upstream and/or downstream of the lock door 10.

The cover 2 is used preferably for easy access to the interior 16. In special embodiments the substrates 15, 15' can be loaded and unloaded, instead of via the lock door 10, via the cover 2 and the lock door 10 can be omitted.

In the center of the housing 1 there is an alignment unit 3 which has a first adjustment unit 4 and a second adjustment unit 4'. On the first adjustment unit 4 a first mount 9 is attached which can be moved by means of the first adjustment unit 4. The movement is controlled by a control unit. The first adjustment unit 4 is fixed on the bottom of the housing 1. On the second adjustment unit 4' a second mount 9' is attached which can be moved by means of the second adjustment unit 4'. The movement is likewise controlled by the control unit. The second adjustment unit 4' is fixed on the cover 2.

A first mounting surface 9o of the first mount 9 is located oppositely a second mounting surface 9o' of the second mount 9' and can be aligned parallel to the first mounting surface 9o. The first mount 9 is used to mount and fix the first substrate 15 on the first contact surface 9O and the second mount 9' is used to mount and fix the second substrate 15' on the second contact surface 9o'. The first contact surface 9o defines a first contact plane and the second contact surface 9o' defines a second contact plane. In a parallel alignment, the contact surfaces 9o, 9o' define an X-Y plane with one X direction and one Y direction as well as one Z direction which runs orthogonally thereto.

There are a first detection unit 11 and a second detection unit 11' on two opposite sides of the alignment unit 3. Each detection unit 11, 11' includes a first and a second fixing translation unit 5, 5' and first and second optics fixing 6, 6' which are mounted thereon.

The optics fixings 6, 6' are made U-shaped, legs 6u, 6o, 6u', 6o' each aligned or able to be aligned from the bottoms 6b, 6b' in the direction of the alignment unit 3, especially being located or able to be located parallel to the X-Y plane.

Detection devices 8, 8', 8", 8"' which are arranged or can be arranged in pairs oppositely and which can be moved via optics translation units 7, 7', 7", 7"' are mounted on the optics fixings 6, 6'. The detection devices 8, 8', 8", 8"' are preferably made as optics.

The fixing translation units 5, 5' are used for extensive movement of the optics fixing 6, 6' which are located on them. By triggering the fixing translation units 5, 5' two detection devices 8, 8' and 8", 8"' which are already calibrated to one another can be moved in translation without losing their calibration.

The optics translation units 7, 7', 7", 7"' are used conversely to move the detection devices 8, 8', 8", 8"', especially for calibration of the detection devices 8, 8', 8", 8"' to a point of an especially common focus plane. The focus planes are defined by focusing of the detection devices 8, 8', 8", 8"', the focus plane comprising especially a focus plane corridor. A focus plane of one detection device pair at a time composed of two detection devices 8, 8' and 8", 8"' on each detection unit 11, 11' separately, preferably of all detection devices 8, 8', 8", 8"' of the detection units 11, 11', is called joint. Preferably the focus planes are parallel to the first contact plane and/or the second contact plane and/or the X-Y plane. In particular the focus planes are between the first and the second contact plane.

In a first calibration step a calibration substrate 12 which has alignment marks 13, 13' which are located on the top 12o on opposite sides is mounted and fixed on the first mount 9. The alignment marks 13, 13' are preferably located in a peripheral region which is closer on one lateral peripheral contour 12k than at a center of gravity of the calibration substrate 12, especially at least twice as close, preferably four times as close. The calibration substrate 12 is preferably transparent so that the detection devices 8', 8"' located laterally to the first mount can measure the alignment marks 13, 13' from the bottom 12u facing the top 12o (FIG. 2a).

In the alignment position the first alignment mark 13 in the X direction is spaced by a distance d from the optical axes 14, 14' of the first detection unit 11, while the second alignment mark 13' in the X direction is spaced by a distance d' which corresponds to the distance d from the optical axes 14", 14"' of the second detection unit 11'.

In a second calibration step according to FIG. 2b the first mount 9 is moved by the first adjustment apparatus 4 in the X direction along the X-Y plane by a travel path which corresponds to the distance d into a first calibration position in which the first alignment mark 13 in the fields of view 19, 19' (see FIGS. 4a to 4f) of the two detection devices 8, 8' of the first detection unit 11 lies.

To the extent an intersection point of the two optical axes 14, 14' of the detection devices 8, 8' does not lie in the first alignment mark 13, the two detection devices 8, 8' are moved by means of the optics translation units 7, 7' until the intersection point of the two optical axes 14, 14' coincides with the first alignment mark 13 of the calibration substrate 12 (see FIG. 2c, middle). In one especially advantageous embodiment the two optical axes 14, 14' are aligned collinearly to one another by means of the optics translation units 7, 7' (FIG. 2c, right).

Figure 2D:
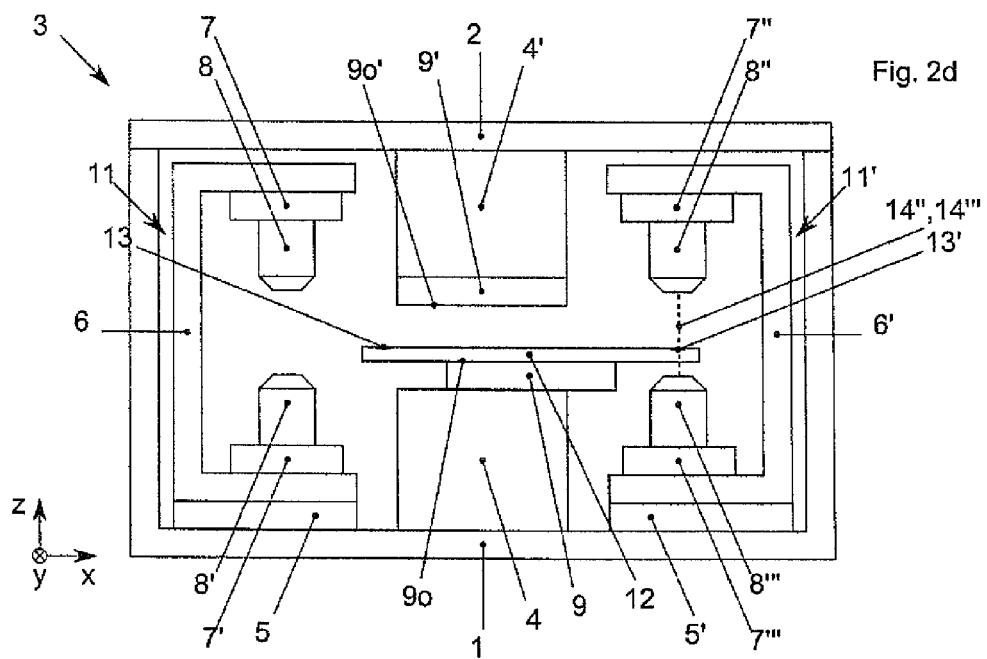
FIG. 2d shows a schematic cross section of the embodiment according to FIG. 1a with a loaded calibration substrate in a third calibration step.

In a third calibration step the first mount 9 is moved by the first adjustment apparatus 4 in the X direction along the X-Y plane by a travel path which corresponds to the distance d' into a second calibration position which is opposite the first calibration position in order to bring the second alignment mark 13' into the fields of view 19", 19"' of the two detection devices 8", 8"' of the second detection unit 11' (FIG. 2d).

Figure 2E:
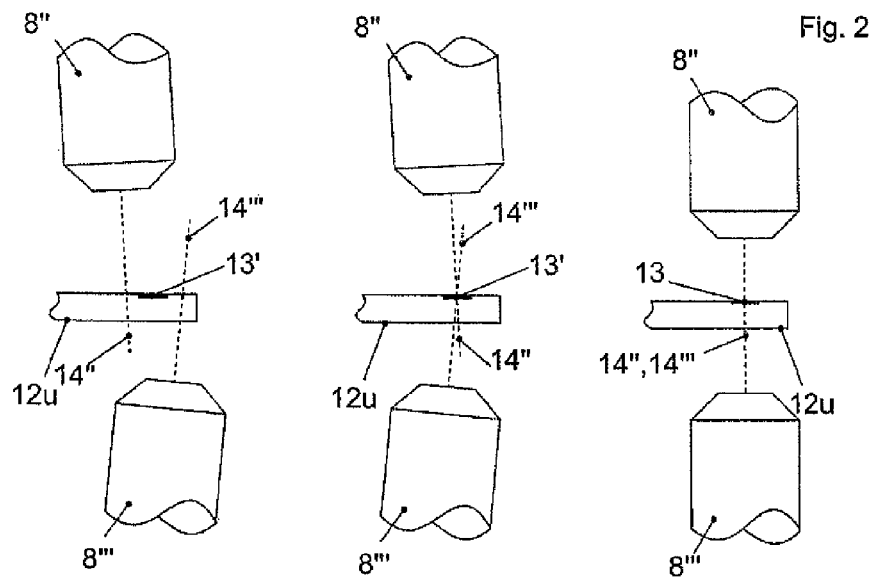
FIG. 2e shows a schematic enlargement of three possible calibration situations in the calibration step according to FIG. 2d.

To the extent an intersection point of the two optical axes 14", 14''' of the detection devices 8", 8''' do not lie in the second alignment mark 13', the two detection devices 8", 8''' are moved by means of the optics translation units 7", 7''' until the intersection point of the two optical axes 14", 14''' coincides with the second alignment mark 13' of the calibration substrate 12 (FIG. 2e, middle). In one especially advantageous embodiment the two optical axes 14, 14' are aligned collinearly to one another by means of the optics translation units 7", 7''' (FIG. 2e, right).

The calibration method can also be viewed from the standpoint of the detection devices 8, 8', 8", 8''' with the respective fields of view 19, 19', 19", 19'''. FIGS. 4a-4f show the above described calibration steps. In the first calibration step the alignment marks 13, 13' are not in the fields of view 19, 19', 19", 19''' so that they are empty (see FIGS. 4a, 4d).

In the second calibration step the alignment mark 13 is moved into the fields of view 19, 19' of the two optics 8, 8' (FIG. 4b). To the extent the alignment mark 13 in the fields of view 19, 19' is imaged blurred and/or uncentered, by translational and/or rotational setting of the respective detection devices 8, 8' high definition and/or centering is effected by the assigned optics translation units 7, 7' and/or focusing (see FIG. 4c). This is controlled by the control unit.

Analogously to the second calibration step the third calibration step runs on the opposite side with the detection unit 11' (see FIGS. 4e, 4f).

The data determined in the calibration method, especially X, Y and/or Z positions of the focus plane(s) and the intersection points of the optical axes 14, 14', 14", 14''', are used in the control apparatus for the computation/control of the method of the invention which is described below.

In a first alignment step, the first substrate 15 is loaded onto the first mount 9 and fixed and the second substrate 15' is loaded onto the second mount 9' and fixed. The first substrate 15 has two alignment markings 20, 20' which are located oppositely especially on the periphery of the side. The second substrate 15' has two alignment marks 20", 20''' which correspond especially to alignment marks 20, 20' and which are located oppositely especially on the periphery of the side. The alignment markings 20, 20', 20", 20''' are preferably located in a peripheral region which is closer on one lateral peripheral contour 15k, 15k' of the substrates 15, 15' than at a center of gravity of the substrate 15, 15', especially at least twice as close, preferably four times as close. Between the first substrate 15 and the second substrate 15' which is aligned parallel thereto by means of the adjustment apparatus 4, 4' a given distance A of less than 1 mm is set.

In the alignment position the alignment markings 20, 20' in the X direction is spaced at a distance D from the optical axes 14, 14' of the first detection unit 11, while the alignment markings 20", 20''' in the X direction are spaced at a distance D' which corresponds especially to the distance D from the optical axes 14", 14''' of the second detection unit 11'.

The distances d, d' of the calibration substrate 12 preferably deviate from the distances D, D' by less than the diameter of the fields of view 19, 19', 19", 19'''.

Figure 3A:
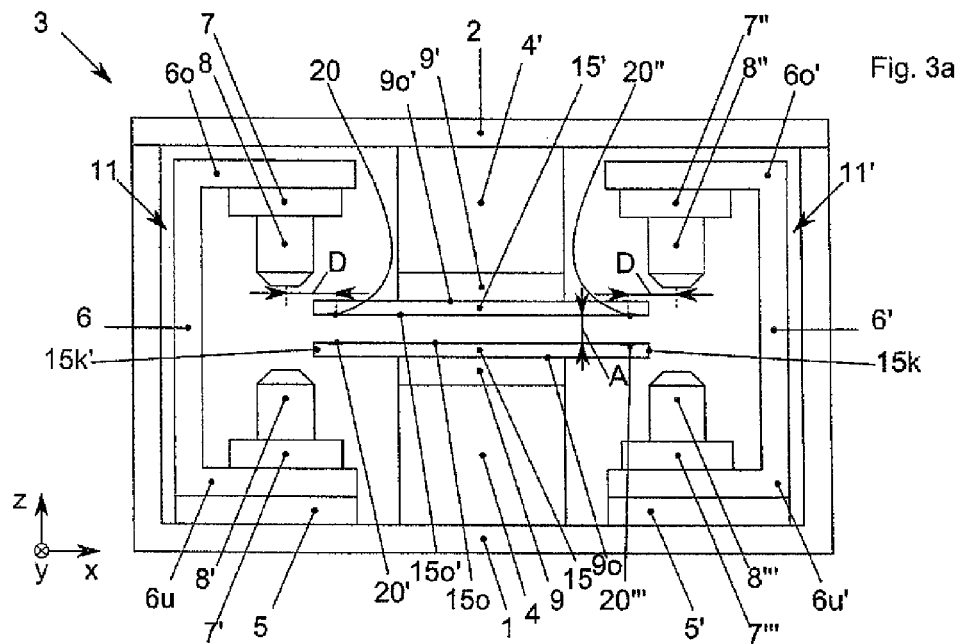
FIG. 3a shows a schematic cross section of the embodiment according to FIG. 1a with two loaded substrates in a first method step of the method of the invention.
Figure 3B:
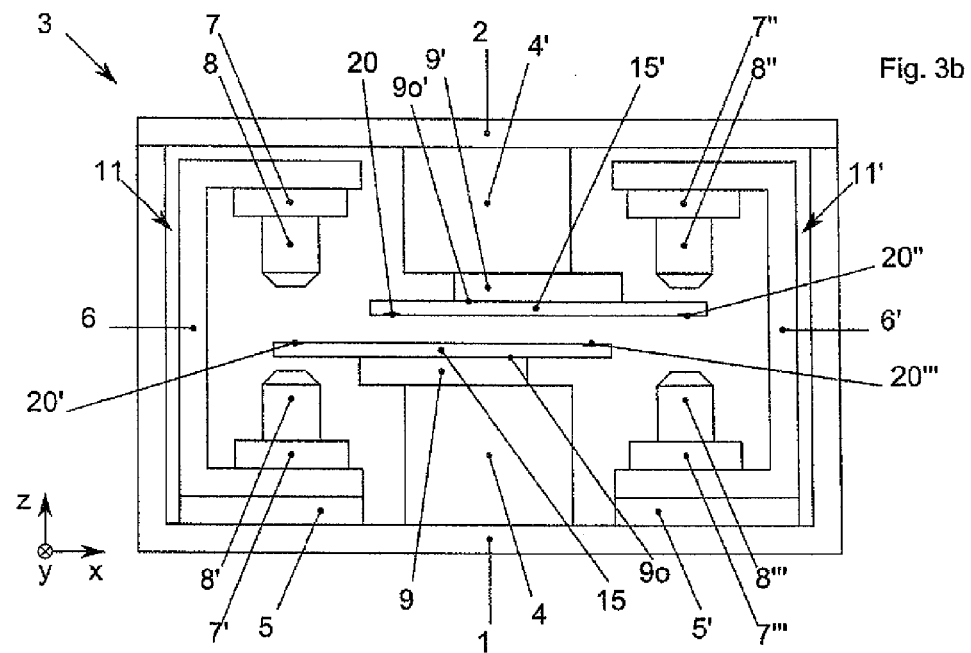
FIG. 3b shows a schematic cross section of the embodiment according to FIG. 1a with two loaded substrates in a second method step of the method of the invention.
Figure 3C:
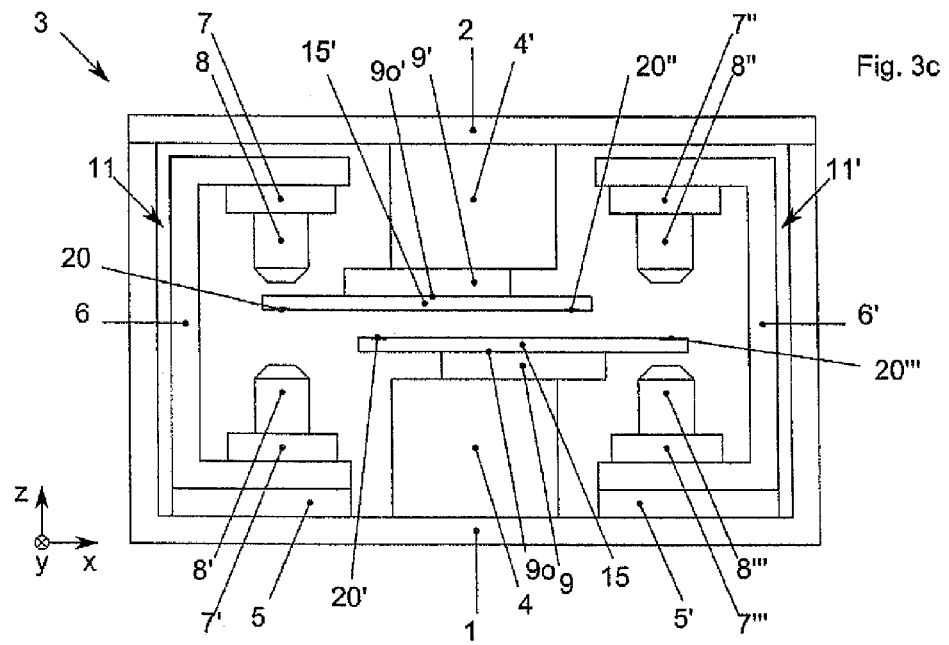
FIG. 3c shows a schematic cross section of the embodiment according to FIG. 1a with two loaded substrates in a third method step of the method of the invention.

In a second alignment step, the first mount 9 for the first detection unit 11 (in the figures according to FIG. 3b left) is moved into a first detection position and the second mount 9', especially at the same time, for the second detection unit 11' (in the figures according to FIG. 3b, right) is moved into a second detection position located oppositely the first detection position. The alignment marking 20' of the first substrate 15 and the alignment marking 20" of the second substrate 15' are detected by the detection devices 8', 8" by their coming to rest in the respective detection position in the respective field of view 19', 19" of the optical axes 14', 14".

In a third alignment step, the first mount 9 for the second detection unit 11' (in the figures according to FIG. 3b, right) is moved into the second detection position and the second mount 9', especially at the same time, for the first detection unit 11 (in the figures according to FIG. 3b, left) is moved into the first detection position. The alignment markings 20''' of the first substrate 15 and the alignment marking 20 of the second substrate 15' are detected by the detection devices 8''', 8 by their coming to rest in the respective detection position in the respective field of view 19''', 19 of the optical axes 14''', 14.

The X, Y and/or Z positions of the substrates 15, 15' from the second and third alignment steps are registered by the adjustment units 4, 4' calibrated to the detection units 11, 11'. Moreover the rotational position of the substrates 15, 15' can be determined from the X, Y and/or Z positions. Furthermore the alignment positions of the substrates 15, 15' are computed from the X, Y and/or Z positions.

Figure 3D:
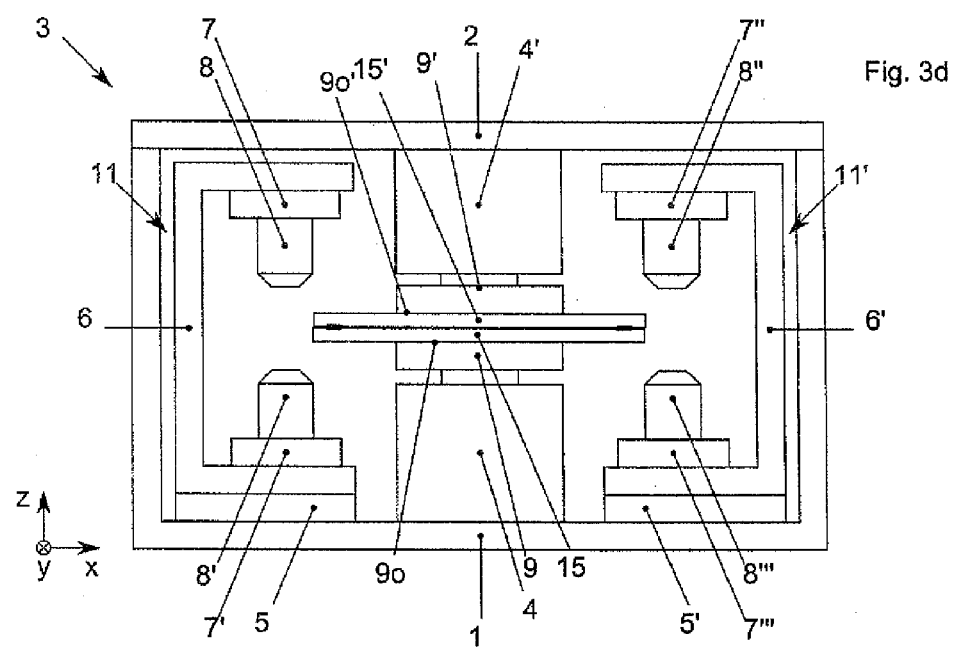
FIG. 3d shows a schematic cross section of the embodiment according to FIG. 1a with two loaded substrates in a fourth method step of the method of the invention.

In a fourth alignment step, the substrates 15, 15' are moved by the adjustment units 4, 4' to the determined alignment positions. Afterwards contact-making takes place by the contact surfaces 15o, 15o' approaching one another in the Z direction (see FIG. 3d).

The idea of the invention therefore lies mainly in the relatively short travel paths between the detection positions and the alignment positions as a result of which positioning errors are minimized.

REFERENCE NUMBER LIST 1 housing
2 cover
3 alignment unit
4, 4' first and second adjustment unit
5, 5' first and second fixing translation unit
6, 6' first and second optics fixing
6u, 6u', 6o, 6o' leg
7, 7', 7", 7''' optics translation unit
8, 8', 8", 8''' detection device
9, 9' first and second mounts
10 lock door
11, 11' first and second optical unit
12 calibration substrate
12o top
12u bottom
12k lateral peripheral contour
13, 13' first and second alignment marks
14, 14', 14", 14''' optical axes
15, 15' first and second substrates
15o, 15o' first and second contact surfaces
15k, 15k' lateral peripheral contours
16 interior
19, 19', 19", 19''' fields of view
20, 20', 20", 20''' alignment markings
A spacing, distance
d, d' spacing, distance
D, D' spacing, distance Having described the invention, the following is claimed:

1. A method for alignment and contact-making of a first substrate with a second substrate, the method comprising:
fixing the first substrate on a first mount and fixing the second substrate on a second mount which is located opposite the first mount, wherein the first and second substrate are located between the first and second mount with a distance A between a first contact surface of the first substrate and a second contact surface of the second substrate in the Z direction, moving the first mount to a first detection unit in a first detection position and moving the second mount to a second detection unit in a second detection position opposite to the first detection position, detecting a first X-Y position of a first alignment marking located in a peripheral region of the first substrate in the first detection position which has moved in an X and/or Y direction along the first contact surface, detecting a second X-Y position of a second alignment marking located in a peripheral region of the second substrate in the second detection position which has moved in an X and/or Y direction along the second contact surface, moving the first mount to the second detection unit in the second detection position and the second mount to the first detection unit in the first detection position, detecting a third X-Y position of a third alignment marking located in a peripheral region of the first substrate in the second detection position, detecting a fourth X-Y position of a fourth alignment marking located in a peripheral region of the second substrate in the first detection position, aligning the first substrate relative to the second substrate by adjustment units based on the first, second, third and fourth X-Y positions which have been detected by the detections, and contacting the first substrate, which has been aligned relative to the second substrate, with the second substrate.

2. The method as claimed in claim 1, wherein the first and fourth alignment marking and/or the second and third alignment marking are arranged oppositely in the Z direction.

3. The method as claimed in claim 1, wherein the detection of the first and second alignment marking and/or the detection of the third and fourth alignment marking takes place using the first detection unit for detection of the first and/or second alignment markings and the second detection unit for detection of the third and/or fourth alignment markings.

4. The method as claimed in claim 3, wherein the detection of the first and second alignment markings and/or the detection of the third and fourth alignment markings take place at the same time.

5. A device for aligning and contact-making of a first substrate with a second substrate, the device comprising:

a first mount for fixing of the first substrate and a second mount located opposite the first mount for fixing of the second substrate, wherein the first and the second substrate are locatable between the first and second mount with a distance between a first contact surface of the first substrate and a second contact surface of the second substrate in a Z direction, a first adjustment unit for moving the first mount at least in one X direction and/or Y direction which runs transversely to the Z direction, a second adjustment unit for moving the second mount at least in one X direction and/or Y direction, detection means for:
  a) detecting a first X-Y position of a first alignment marking located in a peripheral region of the first substrate in a first detection position which has moved in a X and/or Y direction along a first contact surface,
  b) detecting a second X-Y position of a second alignment marking located in a peripheral region of the second substrate in a second detection position which has moved in an X and/or Y direction along the second contact surface,
  c) detecting a third X-Y position of a third alignment marking located in a peripheral region of the first substrate in the second detection position,
  d) detecting a fourth X-Y position of a fourth alignment marking located in a peripheral region of the second substrate in the first detection position,
  wherein the detection means are provided such that visible light is usable for detecting the positions, adjustment units for aligning the first substrate relative to the second substrate based on the first, second, third and fourth X-Y positions which have been detected by the detection means, and contact-making means for contacting the first substrate, which has been aligned relative to the second substrate, with the second substrate in the Z-direction.

6. The device as claimed in claim 5, wherein the contact-making means comprise the first and/or the second adjustment unit.

7. The device as claimed in claim 5, wherein the detection means includes:

a first detection unit for detection of the first and/or second alignment markings, and a second detection unit located on one side of the mounts which is opposite the first detection unit, for detection of the third and/or fourth alignment markings.

8. The device as claimed in claim 7, wherein the first detection unit has a plurality of electromagnetically operating first detection devices located oppositely, and/or the second detection unit has several electromagnetically operating second detection devices located oppositely.

9. The device as claimed in claim 8, wherein the first detection unit has a first optics fixing for attaching the first detection devices and/or the second detection unit has a second optics fixing for attaching the second detection devices, and wherein the first detection devices are movable jointly by a first fixing translation unit which holds the first optics fixing and/or the second detection devices is moveable jointly by a second fixing translation unit which holds the second optics fixing.

10. The device as claimed in claim 9, wherein the first detection devices are each movable separately via first optics translation units on the first optics fixing and/or the second detection devices are each moveable separately via second optics translation units on the second optics fixing.

11. The device as claimed in claim 8, wherein said first and second detection devices are microscopes.

* * * * *